United States Patent [19]

Merrem et al.

[11] Patent Number: 5,066,567

[45] Date of Patent: Nov. 19, 1991

[54] IMAGE REVERSAL PROCESS UTILIZING A POSITIVE-WORKING PHOTOSENSITIVE COMPOSITION CONTAINING A DYE

[75] Inventors: Hans-Joachim Merrem, Seeheim-Jugenheim; Gerhard Buhr, Koenigstein; Ruediger Lenz, Frankfurt am Main, all of Fed. Rep. of Germany

[73] Assignee: Hoechst Aktiengesellschaft, Frankfurt am Main, Fed. Rep. of Germany

[21] Appl. No.: 500,201

[22] Filed: Mar. 28, 1990

Related U.S. Application Data

[62] Division of Ser. No. 260,307, Oct. 20, 1988, Pat. No. 4,927,732.

[30] Foreign Application Priority Data

Oct. 23, 1987 [DE] Fed. Rep. of Germany ....... 3735852

[51] Int. Cl.$^5$ .......................... G03C 5/00; G03C 1/52
[52] U.S. Cl. .................................... 430/325; 430/165; 430/191; 430/328; 430/330; 430/192; 430/196; 430/197; 430/270
[58] Field of Search ............... 430/325, 328, 330, 191, 430/165, 196, 197, 270, 192

[56] References Cited

U.S. PATENT DOCUMENTS

| | | | |
|---|---|---|---|
| 4,349,619 | 9/1982 | Kamoshida et al. ................ | 430/196 |
| 4,575,480 | 3/1986 | Kotani et al. ....................... | 430/192 |
| 4,581,321 | 4/1986 | Stahlhofen ......................... | 430/325 |
| 4,626,492 | 12/1986 | Eilbeck ............................... | 430/191 |
| 4,762,767 | 8/1988 | Haas et al. .......................... | 430/197 |
| 4,931,381 | 6/1990 | Spak et al. .......................... | 430/325 |

FOREIGN PATENT DOCUMENTS

| | | | |
|---|---|---|---|
| 164248 | 12/1985 | European Pat. Off. ............ | 430/191 |
| 231522 | 8/1987 | European Pat. Off. . | |

OTHER PUBLICATIONS

English language abstract of Japanese Publication #61-093,445, Published.
English language abstract of Japanese Publication #61-098,344, Published.
English language abstract of Japanese Publication #61-109,048, Published.
English language abstract of Japanese Publication #61-109,049, Published.
Neureuther, A. R. et al., "Photoresist Modeling and Device Fabrication Applications", Proc. of Symposium on Optical & Acoustical Micro-Electronics, 1974, pp. 233-249.
Stover, H. L. et al., "Submicron Optical Lithography: I-Line Lens and Photoresist Technology"; SPIE vol. 470 Opt. Microlite. III: Tech. for Next Decade; 1984, pp. 22-23.
Bol, I. I., "High Resolution Optical Lithography Using Dyed Single-Layer Resist", Proc. Kodak Microelectronics Semi 1984, pp. 19-22.
Brown, A. V. et al., "Optimization of Resist Optical Density . . . Surfaces": SPIE vol. 539, Advances in Resist Tech. & Process II: 1985, pp. 259-266.
Watts, M. P. C. et al., "The Reduction of Reflective Notches Using Dyed Resist", Proc. of 7th Int. Tech. Conf. on Photopolymer; 10/1985, pp. 285-286.
Pampalone, T. R. et al., "Improving Linewidth Control . . . Resists"; Journal of the Electrochem. Soc., vol. 133, No. 1; Jan. 1986; pp. 192-196.

Primary Examiner—Charles L. Bowers, Jr.
Assistant Examiner—Christopher G. Young
Attorney, Agent, or Firm—Foley & Lardner

[57] ABSTRACT

A positive-working photosensitive composition is disclosed that comprises a photosensitive compound which is either of the o-quinone diazide type or comprises a photolytic acid donor in combination with a compound containing a C-O-C group, a binder which is soluble or swellable in an aqueous-alkaline solution and a dye of the general formula I

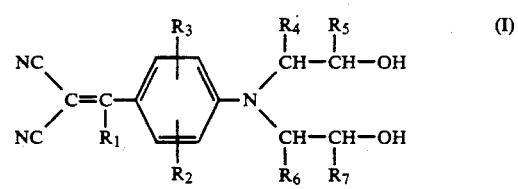

The photosensitive composition of the present invention has a higher photosensitivity than comparable compositions containing other dyes.

18 Claims, No Drawings

IMAGE REVERSAL PROCESS UTILIZING A POSITIVE-WORKING PHOTOSENSITIVE COMPOSITION CONTAINING A DYE

This application is a division of application Ser. No. 07/260,307, filed Oct. 20, 1988, U.S. Pat. No. 4,927,732.

BACKGROUND OF THE INVENTION

The present invention relates to a positive-working photosensitive composition comprising a photosensitive compound, a binder that is insoluble in water and soluble or swellable in an aqueous-alkaline solution, and a dye.

Photosensitive compositions containing a novolak or a polyvinyl phenol as the binder and, for example, an o-quinone diazide as the photosensitive compound have been in use for a long time for the preparation of high-resolution patterns in the fabrication of semiconductor devices. Because of the increasing miniaturization of functional elements, increasingly high demands are placed on the optical resolution of these photosensitive compositions. In particular, difficulties are expected when patterning is effected in the vicinity of the limit of resolution of the optical exposure systems. In these critical areas, resolution is, above all, influenced by disturbing optical effects, such as interference phenomena and undesirable reflections of scattered light from the substrate surface. Effects of this kind can partly be avoided by increasing the non-bleachable absorption of the photosensitive compositions. For this purpose, for example, substances that absorb light in the actinic region are added to the photosensitive compositions.

It has been known for some time to add absorbing substances to photosensitive compositions. As described in EP-A 0 026 088, for example, the image pattern produced can be improved by adding dyes to negative-working photoresists.

The addition of dyes to positive-working photoresists has been described for the first time by A. R. Neureuther and F. H. Dill ("Photoresist Modeling and Device Fabrication Applications", in *Proceedings of Symposium on Optical and Acoustical Micro-Electronics*, Polytechnic Institute of New York, Apr. 16 to 18, 1974, pages 223-249). According to this publication, the dye addition reduces the adverse influences of interference effects on the optical resolution.

According to the paper "Submicron Optical Lithography: I-line Lens and Photoresist Technology" [*SPIE Proceedings*, Vol. 470, pages 22-23 (1984)] by H. L. Stover, M. Nagler, I. I. Bol and V. Miller, optical resolution is markedly improved by the addition of an absorbing dye which absorbs light in the region of the exposure wavelength of $\lambda=436$ nm. However, the exposure time required to generate image patterns has to be considerably extended, compared with a system that does not contain this absorbing substance.

PCT WO 86/01914 describes a process in which the production of photoresist patterns is also improved by the use of a non-bleachable, light-absorbing additive. In this reference it is also pointed out that the exposure time has to be extended by about 50 to 150%, compared with a photoresist without absorbing substance. Particularly preferred dyes mentioned comprise coumarin derivatives.

A coumarin derivative is also described by I. I. Bol in "High-Resolution Optical Lithography Using Dyed Single-Layer Resist" (*Proceedings Kodak Microelectronics Seminar* 1984, pages 19-22) and the significant improvement of the photolithographic properties of a photoresist is confirmed.

The influence of substances absorbing light in the actinic region on the photolithographic properties of positive-working photoresists is described in detail by A. V. Brown and W. H. Arnold in "Optimization of Resist Optical Density for High Resolution Lithography on Reflective Surfaces" [*SPIE Proceedings*, Vol. 539, pages 259-266 (1985)] and by M. P. C. Watts, D. DeBruin and W. H. Arnold in "The Reduction of Reflective Notching Using Dyed Resists" (*Proceedings of Seventh International Technical Conference on Photopolymers*, Ellenville, N.Y., October 1985, pages 285-296). According to these references, the solubility of the photoresist compositions in the aqueous-alkaline developers used is reduced by the addition of substances absorbing light in the actinic region. As a consequence, the photosensitivity of these photoresists is reduced considerably.

In their paper "Improving Linewidth Control over Reflective Surfaces Using Heavily Dyed Resists" [*Journal of the Electrochemical Society*, Vol. 133, No. 1, pages 192-196 (1986)], T. R. Pampalone and K. A. Kuyan describe the influence of high concentrations of absorbing substances in a photoresist. According to the reference particularly good results are obtained with photoresists having a very high absorption in the actinic region. Also in this case it is found that the absorbing compound added clearly reduces photosensitivity, e.g., by a factor of 5 or even more.

U.S. Pat. No. 4,575,480 also describes photoresist formulations containing substances that absorb light in the actinic region. The compounds mentioned are distinguished by their low tendency to sublimation and their high absorption in the actinic region. It is a disadvantage of these photoresist formulations that—depending on the concentration of the substance added—they have a markedly reduced photosensitivity.

Similarly, Japanese Patent Applications 86-159626/25, 86-165777/26, 86-174465/27 and 86-174466/27 describe photoresist formulations that contain absorbing substances that are non-bleachable and do not sublime. In all cases, however, the exposed portions of the resists have a noticeably reduced solubility in the developer solutions.

Photoresists that, apart from a dye absorbing light in the actinic region, also contain a component that increases their solubility, in particular a trihydroxybenzophenone, are described in U.S. Pat. No. 4,626,492. The trihydroxybenzophenone is added in quantities ranging from 12.8 to 13.1% by weight, which, however, leads to a considerable deterioration of the thermal stability of the photoresist. Moreover, a decline in the processing latitude of the resist is observed, since the developing rate strongly depends on the prebaking temperature of the resist film.

SUMMARY OF THE INVENTION

It is therefore an object of the present invention to provide a positive-working photosensitive composition containing a non-bleachable dye that absorbs light in the actinic region and that should either have or produce the following properties:

good solubility in the solvent or solvent mixture of the photosensitive composition, so that undesirable deposits are not formed during storage of the composition, in particular at low temperatures, good thermal stability and low tendency to sublime, so that, on the one hand, constant absorption of actinic radiation is ensured—even at high temperatures—and, on the other hand, contamination of process equipment is kept as low as possible, high absorption in the region of actinic radiation in order to minimize undesirable optical effects in an efficient manner.

These and other objects of the invention are achieved by providing a positive-working photosensitive composition comprising a photosensitive compound, a binder that is insoluble in water and soluble or swellable in an aqueous-alkaline solution, and a dye, wherein the dye comprises a non-bleachable compound which absorbs light in the actinic region and corresponds to the general formula I

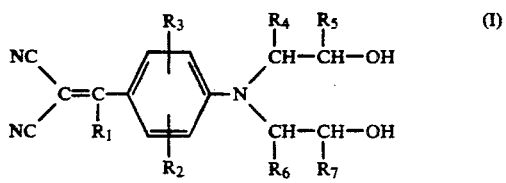

wherein $R_1$ denotes hydrogen, alkyl, aryl, alkoxy or nitrilo, $R_2$ and $R_3$ are identical or different and denote hydrogen, hydroxy, alkyl, aryl, alkoxy, aryloxy, nitrilo, amino, alkylamino or halogen, $R_4$, $R_5$, $R_6$ and $R_7$ are identical or different and denote hydrogen, hydroxy, alkyl, aryl, alkoxy, aryloxy, amino, alkylamino or halogen.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF PREFERRED EMBODIMENTS

Compounds corresponding to the above-indicated general formula I are characterized in that they meet the requirements of high absorption in the actinic region to a special degree.

Particularly unexpected properties of the photosensitive composition according to the invention, that may be mentioned in addition to those indicated above, include:

higher photosensitivity of the composition according to the present invention, compared with photosensitive compositions containing other dyes that also absorb light in the actinic region, no reduction or only a slight reduction of the photosensitivity of the photosensitive composition of the invention, compared with photosensitive compositions that do not contain dyes or contain other dyes.

Preferred dyes absorbing light in the actinic region, corresponding to the general formal I are, in particular, those in which, $R_1$ denotes hydrogen, $(C_1-C_3)$alkyl or phenyl, $R_2$ and $R_3$ denote hydrogen, hydroxy, $(C_1-C_3)$alkyl, $(C_6-C_{10})$aryl, $(C_1-C_3)$alkoxy, amino, $(C_1-C_3)$alkylamino, halogen, in particular, chlorine or bromine, and $R_4$, $R_5$, $R_6$ and $R_7$ denote hydrogen, $(C_1-C_3)$alkyl, $(C_6-C_{10})$aryl, $(C_1-C_3)$alkoxy, amino or halogen, in particular, chlorine.

Preference is given to those dyes of the general formula I, in which $R_1$ denotes hydrogen, $R_2$ and $R_3$ denote hydrogen, hydroxy, $(C_1-C_3)$alkyl, phenyl, amino or chlorine, $R_2$ and/or $R_3$ being, in particular, hydroxy, $(C_1-C_3)$alkyl or phenyl and these being, in each case, preferably in the o-position with respect to the tertiary aromatic amino group and $R_4$ and $R_6$ and $R_5$ and $R_7$ are identical and denote hydrogen, $(C_1-C_3)$alkyl, $(C_1-C_3)$alkoxy, amino or chlorine.

Particularly preferred are those dyes of the general formula I, in which $R_1$ denotes hydrogen, $R_2$ and $R_3$ denote hydrogen, hydroxy or $(C_1-C_3)$alkyl and $R_4$ and $R_6$ and $R_5$ and $R_7$ are identical and denote hydrogen or $(C_1-C_3)$alkyl and of these those are preferred, in which the radicals $R_1$ to $R_7$ are all hydrogen and those, in which the radicals $R_1$ and $R_3$ to $R_7$ are all hydrogen and $R_2$ is methyl.

Of these dyes those are preferably employed that have absorption capacities coinciding as exactly as possible with the wavelength of the actinic radiation used and being, in particular, in the emission range of mercury vapor lamps, especially in the range from 365 to 436 nm and particularly preferably at wavelengths of $\lambda = 365$, 405 or 436 nm. The quantity of dye required to obtain the desired absorption is thus reduced to the minimum.

The concentration of the absorbing dye can range from about 0.05 to 5 % by weight, preferably from about 0.2 to 2% by weight, based on the non-volatile constituents of the photosensitive composition.

The quantity of dye added in each case is naturally dependent on the molar coefficient of extinction of the dye at the respective exposure wavelength. If the quantity of absorbing dye used is too low, the effects of reflection are only reduced insignificantly and the photolithographic properties are improved only slightly or not at all. On the other hand, too high a concentration of absorbing compound leads to a deterioration of image quality, since the areas of the resist layer that are relatively close to the exposure source are overexposed, while the areas of the layer that are in the vicinity of the substrate are underexposed.

The compounds that absorb light in the actinic region, corresponding to formula I, can be prepared according to the processes described in U.S. Pat. Nos. 2,206,108 and 2,583,551 and in DE-A-31 28 159.

The photosensitive compositions according to the present invention also contain a radiation-sensitive or photosensitive compound or a radiation-sensitive or photosensitive combination of compounds. Compounds that may be used are positive-working compounds, i.e., those that are rendered soluble upon exposure. These include, on the one hand, o-quinone diazides and, on the other hand, combinations of photolytic acid donors with acid-cleavable compounds, for example, orthocarboxylic acid or acetal compounds.

O-quinone diazides are known, for example, from DE-C-9 38 233 and DE-C-15 43 721 and from DE-A-23 31 377, DE-A-25 47 905 and DE-A-28 28 037. Preferred o-quinone diazides comprise 1,2-naphthoquinone-2-diazide-4- or -5-sulfonic acid esters or amides. Of these, the esters, especially the esters of sulfonic acids, are particularly preferred. The quantity of o-quinone diazide compounds contained in the photosensitive composition of the present invention usually ranges from about 3 to 50% by weight, preferably from about 7 to 35% by weight, based on the nonvolatile constituents of the composition.

Of the acid-cleavable materials the following are used:

a) Compounds containing at least one orthocarboxylic ester and/or carboxyamide acetal group; it being possible for the compounds to have a polymeric character and for the groups mentioned to be present as linking members in the principal chain or as lateral substituents;
b) oligomeric or polymeric compounds containing recurrent acetal and/or ketal groups in the principal chain;
c) compounds having at least one enol ether or N-acyliminocarbonate group;
d) cyclic acetals or ketals of β-ketoesters or amides;
e) compounds containing silylether groups;
f) compounds containing silylenolether groups;
g) monoacetals or monoketals, the aldehyde or ketone components of which have a solubility in the developer ranging from 0.1 and 100 g/l;
h) ethers based on tertiary alcohols; and
i) carboxylic acid esters and carbonates of tertiary allylic or benzylic alcohols.

Acid-cleavable compounds of type a), which are used as components of radiation-sensitive compositions are described in detail in DE-A-29 28 636 (=EP-A-0 022 571) and DE-A-26 10 842 and in U.S. Pat. No. 4,101,323; compositions containing compounds of type b) are described in DE-C-23 06 248 (=U.S. Pat. No. 3,779,778) and DE-C-27 18 254; compounds of type c) are described in EP-A-0 006 626 and EP-A-0 006 627 and compounds of type d) in EP-A-0 202 196; compounds corresponding to type e) are presented in DE-A-35 44 165 and DE-A-36 01 264; compounds of type f) are disclosed in German Patent Application, file No. P 37 30 783.5, filed Sept. 13, 1987 and compounds of type g) in German Patent Applications, file Nos. P 37 30 785.1 and P 37 30 787.8, also filed Sept. 13, 1987. Compounds of type h) are described, for example, in U.S. Pat. No. 4,603,101 and compounds of type i), for example, in U.S. Pat. No. 4,491,628 and by J. M. Fréchet et al in *J. Imaging Sci.*, 30, 59–64 (1986).

Preferred compounds contain C—O—C groups which can be split by acid.

U.S. Pat. No. 4,101,323 describes orthocarboxylic acid derivatives and of these the bis-1,3-dioxan-2-yl ethers of aliphatic diols are used in particular. Of the polyacetals described in DE-C-27 18 254 those containing aliphatic aldehyde and diol units are preferred.

Other suitable compositions are disclosed in EP-A-0 022 571. This publication describes polymeric orthoesters with recurrent orthoester groups in their principal chain as acid-cleavable compounds. These groups comprise 2-alkylethers of 1,3-dioxacycloalkanes having 5 or 6 ring members. Particularly preferred are polymers with recurrent 1,3-dioxa-cyclohex-2-yl alkylether units, wherein the alkylether group can be interrupted by ether oxygen atoms and is preferably linked to the 5-position of the adjacent ring.

The photosensitive or radiation-sensitive acid donors contained in these compositions primarily comprise organic halogen compounds. The halogen compounds include, in particular, the triazine derivatives disclosed in U.S. Pat. Nos. 3,515,552; 3,536,489 and 3,779,778 and in DE-C-27 18 259; DE-C-33 37 024; DE-C-33 33 450; DE-C-23 06 248, DE-C-22 43 621 and DE-C-12 98 414. These triazine derivatives can, however, also be used in combination with other photoinitiators, for example, oxazoles, oxadiazoles or thiazoles or in mixtures with each other.

Oxazoles, oxadiazoles, thiazoles or 2-pyrones containing trichloro or tribromomethyl groups are also known (DE-A-30 21 599, DE-A-30 21 590, DE-A-28 51 472, DE-A-29 49 396 and EP-A-0 135 348 and EP-A-0 135 863).

This general term also includes, in particular, aromatic compounds, in which halogen, preferably bromine, is attached to the aromatic ring. Compounds of this type are, for example, known from DE-A-26 10 842.

The amount of acid-cleavable compounds contained in the photosensitive composition according to the present invention is, in general, in the range from about 8 to 65% by weight, preferably from about 14 to 44% by weight, based on the non-volatile constituents of the composition. The amount of acidforming compounds ranges from about 0.1 to 10% by weight, preferably from about 0.2 to 5% by weight, also based on the non-volatile constituents of the composition.

In addition to the above-described photosensitive constituents, the coating solutions of the present invention comprise polymeric binders. The preferred polymers are insoluble in water and soluble or at least swellable in aqueous-alkaline solutions.

Alkali-soluble or at least alkali-swellable binders that may be mentioned comprise natural resins, such as shellac and colophony, and synthetic resins, such as copolymers of styrene and maleic anhydride or copolymers of acrylic acid or methacrylic acid, in particular, with acrylic or methacrylic acid esters, and especially novolak resins.

Novolak condensation resins that have proved suitable include, in particular, the relatively highly condensed resins with substituted phenols as the condensation partners of formaldehyde. Examples of these are phenol-formaldehyde resins, cresol-formaldehyde resins, the co-condensates and mixtures thereof and phenol and cresol condensates with formaldehyde.

Instead of or in admixture with novolaks, phenolic resins, e.g.poly(4-vinylphenol) can also advantageously be used.

The type and quantity of the alkali-soluble resins used can vary according to the intended application. Preference is given to amounts ranging from about 30 to 90% by weight, particularly preferably from about 55 to 85% by weight, based on total solids contained in the composition.

A great number of other resins can additionally be used; preferred are vinyl polymers, such as polyvinyl acetates, poly(meth)acrylates, polyvinyl ethers, polyvinyl pyrrolidones and styrene polymers, which themselves may be modified by comonomers. The following are mentioned in particular: polymers of styrene containing units of alkenylsulfonyl-aminocarbonyloxy or cycloalkenylsulfonyl-aminocarbonyloxy (EP-A-0 184 804); polymers of acrylic, methacrylic, maleic, itaconic acid, etc., having lateral, crosslinking —CH$_2$OR groups (EP-A-0 184 044); polymers of vinyl monomers containing alkenyl phenol units (EP-A-0 153 682); polyvinyl phenols as substituents for novolak (DE-C-23 22 230); polymeric binders with lateral phenolic hydroxyl groups (EP-A-0 212 439 and EP-A-0 212 440); styrene-maleic anhydride copolymers (DE-A-31 30 987); polymers formed from unsaturated (thio)phosphinic acid iso(thio)cyanates with a polymer containing active hydrogen (German Patent Applications P 36 15 612.4 and P 36 15 613.2); polymers containing vinyl acetate, vinyl alcohol and vinyl acetal units (EP-A-0 216 083) and polyvinyl acetals having units of hydroxyaldehydes (German Patent Application P 36 44 162.7).

The most favorable amount of these resins used in the binder of the photosensitive composition according to the present invention depends on application-related requirements and on their influence on development conditions and is, in general, not more than about 20% by weight of the alkali-soluble resin.

The photosensitive compositions of the present invention can optionally also be admixed with dyes, finely-divided pigments, plasticizers, wetting agents and levelling agents and, in addition, polyglycols and cellulose derivatives, e.g., ethyl cellulose, to improve specific properties, such as flexibility, adhesion and gloss.

It is also possible to add usual crosslinking substances to the photosensitive composition. Compounds of this type are, for example, specified in EP-A 0 212 482.

The photosensitive composition of the invention is preferably dissolved in solvents comprising, for example, ethylene glycol; glycol ethers, such as glycol monomethyl ether, glycol dimethyl ether, glycol monoethyl ether or propylene glycol monoalkyl ethers, in particular propylene glycol methyl ether; aliphatic esters, such as ethyl acetate, hydroxyethyl acetate, alkoxyethyl acetate, n-butyl acetate, propylene glycol monoalkylether acetate, in particular propylene glycol methyl ether acetate or amyl acetate; ethers, such as dioxane; ketones, such as methyl ethyl ketone, methyl isobutyl ketone, cyclopentanone and cyclohexanone; dimethylformamide, dimethylacetamide, hexamethyl phosphoric acid amide, N-methylpyrrolidone, butyrolactone, tetrahydrofuran and mixtures thereof. Glycol ethers, aliphatic esters and ketones are particularly preferred.

Depending on the types of photosensitive compounds and binders used and also on the intended application, the total solids content of the composition according to the present invention generally varies between about 10 to 50% by weight, preferably between about 15 to 35% by weight.

A photosensitive recording material that comprises a substrate and the photosensitive composition applied to this substrate is also provided according to the invention.

Substrates that may be used include any materials suitable for the production of capacitors, semiconductors, multilayer printed circuits or integrated circuits. Particularly suitable surfaces are those comprising a thermally oxidized and/or aluminum coated silicon material and that are optionally doped, including any other substrates customarily used in semiconductor technology, for example, silicon nitride, gallium arsenide and indium phosphide. Other appropriate substrates are those known from the manufacture of liquid crystal displays, such as glass and indium tin oxide; and, in addition, metal plates and foils, e.g., comprising aluminum, copper or zinc; bimetallic and trimetallic foils and also electrically nonconductive sheets that are vacuum metallized, optionally aluminum-coated SiO$_2$ materials and paper. These substrates may be subjected to a thermal pretreatment, roughened on their surfaces, slightly etched or treated with chemicals, in order to obtain desirable properties, e.g., an improvement of the hydrophilic character.

In a special embodiment, the photosensitive recording material may comprise an adhesion promoter dissolved in the resist formulation or applied between the resist and the substrate in order to improve the adhesion of the resist. Adhesion promoters of the aminosilane type, for example, 3-aminopropyl-triethoxysilane or hexamethyldisilizane are appropriately used in the case of silicon or silicon dioxide substrates.

Examples of supports that can be used in the production of photomechanical recording materials, for example, printing plates for relief printing, lithographic printing, screen printing or gravure printing and in the production of relief copies, include optionally anodically oxidized aluminum plates, grained and/or silicated aluminum plates, zinc plates, steel plates, optionally coated with chromium, and also plastic sheets or paper.

The photosensitive composition can be applied to the support to be coated using customary methods, such as dip-coating, flow-coating, spin-coating, spraying, roller-coating or application through slot dies.

The recording materials according to the present invention are exposed imagewise. Sources of actinic light include metal halide lamps, carbon arc lamps, xenon lamps and mercury vapor lamps, which have emission peaks in the near ultraviolet or shortwave visible light. Imaging can also be effected by means of electron-beam, x-ray or laser radiation. Suitable lasers are, in particular, helium/neon lasers, argon lasers, krypton lasers and helium/cadmium lasers.

After an optional heating of the recording material, the layer applied—provided that it comprises a crosslinking agent—can be subjected to an overall reexposure to actinic radiation to achieve image reversal.

The layer thickness of the photosensitive layer depends on the intended field of application and varies between about 0.1 to 100 μm, in particular, between about 1 and 10 μm.

Aqueous-alkaline solutions of graduated alkalinity, i.e., preferably having a pH of 10 to 14, and which may also contain minor amounts of organic solvents or wetting agents are used for development. These solutions remove the exposed areas of the recording layer and thus produce a positive image of the original.

In the following examples preferred embodiments of the invention are described. Quantitative ratios and percentages relate to weight units, unless otherwise indicated.

EXAMPLE 1

A photosensitive composition comprising
7.0 pbw of the esterification product of 1 mol of 2,3,4-trihydroxybenzophenone and 2 mols of 1,2-naphthoquinone-diazide-5-sulfonyl chloride,
23.0 pbw of a poly-p-vinylphenol having a glass transition temperature of 165° C., 0.8 pbw of 4-bis-(2-hydroxyethyl)-aminophenyl-methylene-propanedinitrile,
28.0 pbw of ethylene glycol monoethyl ether acetate,
3.5 pbw of n-butyl acetate, and
3.5 pbw of xylene was applied to a silicon wafer by spin-coating at 4,000 rpm and dried in a circulating air oven at 90° C. for 30 minutes. The 2.03 μm thick layer was exposed to actinic radiation of wavelength λ=436 nm in 8 different places using energies from 31.4 to 169 mJ/cm². The exposed layer was developed in a solution comprising 0.61 pbw of sodium metasilicate.9H₂O
0.46 pbw of trisodium phosphate.12H₂O
0.04 pbw of monosodium phosphate, anhydrous in 98.89 pbw of deionized water.

After a development time of 60 seconds at 21° C., 1 μm of resist thickness had been dissolved from the area exposed at 104.8 mJ/cm².

EXAMPLE 2 (COMPARISON EXAMPLE)

A photosensitive composition comprising
7.0 pbw of the esterification product of 1 mol of 2,3,4-trihydroxybenzophenone and 2 mols of 1,2-naphthoquinonediazide-5-sulfonyl chloride,
23.0 pbw of a poly-p-vinylphenol having a glass transition temperature of 165° C.,
1.07 pbw of coumarin 338 (equimolar quantity to the absorbing compound specified in Example 1),
28.0 pbw of ethylene glycol monoethyl ether acetate,
3.5 pbw of n-butyl acetate, and
3.5 pbw of xylene was applied to a silicon wafer by spin-coating at 4,000 rpm and dried in a circulating air oven at 90° C. for 30 minutes. The 2.13 μm thick layer was exposed to actinic radiation of wavelength λ=436 nm in 8 different places using energies from 50.7 to 273 mJ/cm². The exposed layer was developed in a solution comprising 0.61 pbw of sodium metasilicate.9H₂O
0.46 pbw of trisodium phosphate.12H₂O
0.04 pbw of monosodium phosphate, anhydrous in 98.89 pbw of deionized water After a development time of 60 seconds at 21° C., 1 μm of resist thickness had been dissolved from the area exposed at 198 mJ/cm².

EXAMPLE 3 (COMPARISON EXAMPLE)

A photosensitive composition comprising
7.0 pbw of the esterification product of 1 mol of 2,3,4-trihydroxybenzophenone and 2 mols of 1,2-naphthoquinonediazide-5-sulfonyl chloride,
23.0 pbw of a poly-p-vinylphenol having a glass transition temperature of 165° C.,
28.0 pbw of ethylene glycol monoethyl ether acetate,
3.5 pbw of n-butyl acetate, and
3.5 pbw of xylene was applied to a silicon wafer by spin-coating at 4,000 rpm and dried in a circulating air oven at 90° C. for 30 minutes. The 2.05 μm thick layer was exposed to actinic radiation of wavelength λ=436 nm in 8 different places using energies from 25 to 136 mJ/cm². The exposed layer was developed in a solution comprising 0.61 pbw of sodium metasilicate.9H₂O
0.46 pbw of trisodium phosphate.12H₂O
0.04 pbw of monosodium phosphate, anhydrous in 98.89 pbw of deionized water After a development time of 60 seconds at 21° C., 1 μm of resist thickness had been dissolved from the area exposed at 53 mJ/cm².

Comparison between Examples 1 to 3 shows that, on condition that resolution is comparable, the photosensitivity of a photoresist formulation containing an absorbing compound according to formula I (Example 1) decreases by only 97% as against a resist which is free of an additive compound (Example 3), whereas an addition of equimolar quantities of coumarin 338 (Example 2) reduces the practical photosensitivity by 273%.

EXAMPLE 4

A photosensitive composition comprising
3.0 pbw of the bis-(5-ethyl-5-butyl-1,3-dioxan-2-yl) ether of 2-ethyl-butyl-propane-1,3-diol,
10.0 pbw of a cresol-formaldehyde novolak having a melting range from 147° to 150° C.,
0.5 pbw of 2-(4-ethoxynaphth-1-yl)-4,6-bis-trichloromethyl-s-triazine,
0.08 pbw of 4-bis-(2-hydroxyethyl)aminophenyl-methylene-propanedinitrile, and
35.0 pbw of propylene glycol monomethyl ether acetate was applied to a silicon wafer by spin-coating at 4,000 rpm and dried in a circulating air oven at 90° C. for 30 minutes. The 0.93 μm thick layer was exposed to actinic radiation of wavelength λ=436 nm in 8 different places using energies from 24.3 to 131 mJ/cm².

The exposed layer was developed in a 1% aqueous sodium hydroxide solution. At an exposure energy of 59.0 mJ/cm² the substrate was completely developed after 60 seconds at 21° C.

EXAMPLE 5 (COMPARISON EXAMPLE)

A photosensitive composition comprising
3.0 pbw of the bis-(5-ethyl-5-butyl-1,3-dioxan-2-yl)ether of 2-ethyl-butyl-propane-1,3-diol,
10.0 pbw of a cresol-formaldehyde novolak having a melting range from 147° to 150° C.,
0.5 pbw of 2-(4-ethoxynaphth-1-yl)-4,6 -bis-trichloromethyl-s-triazine,
0.107 pbw of coumarin 338, and
35.0 pbw of propylene glycol monomethyl ether acetate was applied to a silicon wafer by spin-coating at 4,000 rpm and dried in a circulating air oven at 90° C. for 30 minutes. The 0.94 μm thick layer was exposed to actinic radiation of wavelength λ=436 nm in 8 different places using energies from 24.3 to 131 mJ/cm².

The exposed layer was developed in a 1% aqueous sodium hydroxide solution. At an exposure energy of 131.0 mJ/cm² the substrate was completely developed after 60 seconds at 21° C.

EXAMPLE 6 (COMPARISON EXAMPLE)

A photosensitive composition comprising
3.0 pbw of the bis-(5-ethyl-5-butyl-1,3-dioxan-2-yl)-ether of 2-ethyl-butyl-propane-1,3-diol,
10.0 pbw of a cresol-formaldehyde novolak having a melting range from 147° to 150° C.,
0.5 pbw of 2-(4-ethoxynaphth-1-yl)-4,6-bis-trichloromethyl-s-triazine,
35.0 pbw of propylene glycol monomethyl ether acetate was applied to a silicon wafer by spin-coating at 4,000 rpm and dried in a circulating air oven at 90° C. for 30 minutes. The 0.94 μm thick layer was exposed to actinic radiation of wavelength λ=436 nm in 8 different places using energies from 24.3 to 131 mJ/cm².

The exposed layer was developed in a 1% aqueous sodium hydroxide solution. At an exposure energy of 36.3 mJ/cm² the substrate was completely developed after 60 seconds at 21° C.

Comparison between Examples 4 to 6 shows that, on condition that resolution is comparable, the photosensitivity of a photoresist formulation containing an absorbing compound according to formula I (Example 4) decreases by only 62% as against a resist which is free of an additive compound (Example 6), whereas an addition of equimolar quantities of coumarin 338 (Example 5) reduces the practical photosensitivity by 261%.

EXAMPLES 7 to 15

A photosensitive composition comprising
- 3.5 pbw of the esterification product of 1 mol of 2,3,4-trihydroxybenzophenone and 2 mols of 1,2-naphthoquinonediazide-5-sulfonyl chloride,
- 11.9 pbw of a cresol-formaldehyde novolak having a melting range from 147° to 150° C.,
- 27.7 pbw of ethylene glycol monoethyl ether acetate,
- 3.45 pbw of n-butyl acetate, and
- 3.45 pbw of xylene was, in each case, admixed with one of the absorbing substances listed in Table 1 and mixed to give a homogeneous solution. This solution was applied to a silicon wafer by spin-coating at 4,000 rpm and dried in a circulating air oven at 90° C. for 30 minutes. The layers having a thickness of about 1.8 μm were exposed to actinic radiation of λ=436 nm in 8 different places using different exposure energies. The wafers were then developed in an 0.27N aqueous solution of tetramethyl ammonium hydroxide. After a development time of 60 seconds at 21° C. the thicknesses of the resist layers were measured in the differently exposed areas and the energy values required for dissolving a 1 μm thick resist layer were determined.

TABLE 1

| Example No. | Absorbing compounds added | Energy required for dissolving 1 μm of resist layer |
|---|---|---|
| 7 (C) | without additive compound | 42.8 mJ/cm² |
| 8 (C) | 0.1006 g of coumarin 338 | 49.8 mJ/cm² |
| 9 (C) | 0.0978 g of coumarin 314 | 49.2 mJ/cm² |
| 10 (C) | 0.1041 g of coumarin 7 | 62.4 mJ/cm² |
| 11 | 0.0803 g of 4-bis-(2-hydroxyethyl)-aminophenyl-methylene-propanedinitrile | 43.6 mJ/cm² |
| 12 (C) | 0.1241 g of 4-bis-(2-isopropyl-carbonyl-oxyethyl)-aminophenyl-methylene-propanedinitrile | 60.5 mJ/cm² |
| 13 (C) | 0.1327 g of 4-bis-(2-tert-butyl-carbonyl-oxyethyl)-aminophenyl-methylene-propanedinitrile | 59.1 mJ/cm² |
| 14 (C) | 0.0753 g of 4-(2-hydroxyethyl)-4'-ethyl-aminophenyl-methylene-propanedinitrile | 48.3 mJ/cm² |
| 15 (C) | 0.084 g of 4-(2-hydroxyethyl)-4'-n-butyl-aminophenyl-methylene-propanedinitrile | 58.9 mJ/cm² |

Comparison between the energy values shows that the lowest energy for dissolving the resist layer is required using a dye according to formula I (Example 11).

EXAMPLE 16

A photosensitive composition comprising
- 6.0 pbw of the esterification product of 1 mol of 2,3,4-trihydroxybenzophenone and 3 mols of 1,2-naphthoquinonediazide-4-sulfonyl chloride,
- 89.0 pbw of a cresol-formaldehyde novolak having a melting range from 147° to 150° C.,
- 5.0 pbw of hexamethylol-melamine-hexamethyl ether,
- 2.0 pbw of bis-(2-hydroxyethyl)aminophenylmethylene-propanedinitrile, and
- 370.0 pbw of propylene glycol monomethyl ether acetate was applied to a silicon wafer by spin-coating at 4,000 rpm and dried on a hotplate at 90° C. for 1 minute. The 1.4 μm thick layer was exposed to actinic radiation of λ=436 nm in 8 different places and then developed with the following solution:
- 2.25 pbw of sodium metasilicate.9H₂O
- 1.7 pbw of trisodium phosphate.12H₂O
- 0.15 pbw of monosodium phosphate, anhydrous in
- 95.80 pbw of deionized water.

After a development time of 60 seconds at 21° C. the resist layer exposed at 160 mJ/cm² had been cleaned out down to the substrate.

A second silicon wafer was coated, prebaked and exposed in the same manner. It was thereafter heated at 120° C. for 60 seconds and then exposed overall to actinic radiation at 200 mJ/cm². The desired crosslinking of the areas exposed first was achieved at an exposure energy of 90 mJ/cm².

EXAMPLE 17 (COMPARISON EXAMPLE)

A photosensitive composition corresponding to that of Example 16, but without the addition of bis-(2-hydroxyethyl)aminophenyl-methylenepropanedinitrile was processed as described in Example 16.

An exposure energy of 125 mJ/cm² was sufficient for the complete development of the resist layer.

The desired crosslinking of the resist layer was observed at an exposure energy of 75 mJ/cm².

Comparison between Examples 16 and 17 shows that by adding the dye according to formula I photosensitivity decreases by only 28% (for the production of positive resist patterns) or 20% (for the production of negative resist patterns).

What is claimed is:

1. A process for the production of a relief pattern according to the image reversal process, the process comprising the steps of:

coating a support with a photosensitive composition comprising in admixture a photosensitive compound selected from the group consisting of (a) a combination of a photolytic acid donor and an acid-cleavable compound containing a C—O—C group and (b) an o-quinone diazide, in an amount sufficient to change the solubility of areas of a layer of the composition that have been exposed to actinic light, a binder that is insoluble in water and soluble or swellable in an aqueous-alkaline solution in an amount sufficient to produce a uniform film when the composition is coated on the support, a crosslinking agent in an amount sufficient to effect crosslinking of the binder and a dye comprising a non-bleachable compound that absorbs light in the actinic region and corresponds to the general formula I

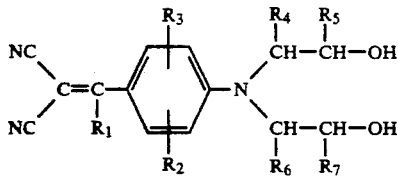

wherein
- $R_1$ denotes hydrogen, alkyl, aryl, alkoxy or nitrilo,
- $R_2$ and $R_3$ are identical or different and denote hydrogen, hydroxy, alkyl, aryl, alkoxy, aryloxy, nitrilo, amino, alkylamino or halogen, and
- $R_4$, $R_5$, are identical or different and denote $R_6$ and $R_7$ hydrogen, hydroxy, alkyl, aryl, alkoxy, aryloxy, amino, alkylamino or halogen, the dye being present in an amount sufficient to reduce interference effects on optical resolution, drying the layer, imagewise exposing the layer to actinic light, then subjecting the layer to an overall reexposure by means of actinic radiation, and then developing the layer with an aqueous-alkaline solution to remove the imagewise unexposed areas and achieve image reversal.

2. A process as claimed in claim 1, wherein the dye has an absorption peak in the range of the emission of mercury vapor lamps.

3. A process as claimed in claim 1, wherein the dye has an absorption peak in the region from 365 to 436 nm.

4. A process as claimed in claim 1, wherein the photolytic acid donor comprises an organic halogen compound.

5. A process as claimed in claim 1, wherein the binder comprises a novolak condensation resin.

6. A process as claimed in claim 5, wherein the alkali-soluble novolak condensation resin is blended with up to 20% by weight of at least one other resin.

7. A process as claimed in claim 1, wherein the photosensitive layer consists essentially of the photosensitive compound, the binder, the crosslinking agent and the dye.

8. A process as claimed in claim 7, consisting essentially of the steps of coating the support with the layer, drying the layer, imagewise exposing the layer, subjecting the layer to overall reexposure, and developing the layer.

9. A process as claimed in claim 1, wherein
- $R_1$ denotes hydrogen, $(C_1-C_3)$alkyl or phenyl,
- $R_2$ and $R_3$ denote hydrogen, hydroxy, $(C_1-C_3)$alkyl, $(C_6-C_{10})$aryl, $(C_1-C_3)$alkoxy, amino, $(C_1-C_3)$alkylamino, halogen, and
- $R_4$, $R_5$ denote hydrogen, $(C_1-C_3)$alkyl, $(C_6-C_{10})$
- $R_6$ and $R_7$ aryl, $(C_1-C_3)$alkoxy, amino or halogen.

10. A process as claimed in claim 1, wherein
- $R_1$ denotes hydrogen,
- $R_2$ and $R_3$ denote hydrogen, hydroxy $(C_1-C_3)$alkyl, phenyl, amino or chlorine, and
- $R_4$ and $R_6$
and
- $R_5$ and $R_7$ are identical and denote hydrogen, $(C_1-C_3)$alkyl, $(C_1-C_3)$alkoxy, amino or chlorine.

11. A process as claimed in claim 1, wherein
- $R_1$ denotes hydrogen,
- $R_2$ and $R_3$ denote hydrogen, hydroxy or $(C_1-C_3)$alkyl
and
- $R_4$ and $R_6$
and
- $R_5$ and $R_7$ are identical and denote hydrogen or $(C_1-C_3)$alkyl.

12. A process as claimed in claim 1, wherein the radicals $R_1$ to $R_7$ are all hydrogen.

13. A process as claimed in claim 1, wherein the radicals $R_1$ and $R_3$ to $R_7$ are all hydrogen and $R_2$ is methyl.

14. A process as claimed in claim 1, wherein $R_2$ and/or $R_3$ are hydroxy, $(C_1-C_3)$alkyl or phenyl.

15. A process as claimed in claim 1, wherein $R_2$ and/or $R_3$ are in each case in the o-position with respect to the tertiary aromatic amino group.

16. A process as claimed in claim 1, wherein $R_2$ and $R_3$ denote chlorine or bromine and $R_4$, $R_5$, $R_6$ and $R_7$ denote chlorine.

17. A process as claimed in claim 1, wherein the dried layer comprises from 0.05 to 5% by weight of the dye.

18. A process as claimed in claim 1, wherein the dried layer comprises from 0.02 to 2% by weight of the dye.

* * * * *